(12) United States Patent
Mebarki et al.

(10) Patent No.: US 8,551,880 B2
(45) Date of Patent: Oct. 8, 2013

(54) AMMONIA-BASED PLASMA TREATMENT FOR METAL FILL IN NARROW FEATURES

(75) Inventors: Bencherki Mebarki, Santa Clara, CA (US); Amit Khandelwal, Cupertino, CA (US); Linh H. Thanh, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/262,964

(22) Filed: Oct. 31, 2008

(65) Prior Publication Data

US 2009/0117736 A1    May 7, 2009

Related U.S. Application Data

(60) Provisional application No. 60/984,709, filed on Nov. 1, 2007.

(51) Int. Cl.
*H01L 21/44* (2006.01)

(52) U.S. Cl.
USPC .... 438/660; 438/675; 438/680; 257/E21.476; 257/E21.482

(58) Field of Classification Search
USPC ......... 438/618, 760, 240, 481, 660, 675, 677, 438/680; 257/E21.476, E21.482
See application file for complete search history.

(56) References Cited

U.S. PATENT DOCUMENTS

| | | | |
|---|---|---|---|
| 6,136,693 A * | 10/2000 | Chan et al. | 438/633 |
| 6,682,974 B2 * | 1/2004 | Kim | 438/240 |
| 7,071,113 B2 * | 7/2006 | Kim et al. | 438/706 |
| 7,125,809 B1 * | 10/2006 | Hillyer et al. | 438/725 |
| 7,470,614 B1 * | 12/2008 | Wiseman | 438/637 |
| 2001/0053586 A1 * | 12/2001 | Lee et al. | 438/481 |
| 2002/0132469 A1 * | 9/2002 | Lee et al. | 438/628 |
| 2005/0181588 A1 * | 8/2005 | Kim | 438/586 |
| 2006/0019201 A1 * | 1/2006 | Muramatsu et al. | 430/311 |
| 2007/0082130 A1 * | 4/2007 | Shinriki et al. | 427/250 |
| 2009/0111209 A1 * | 4/2009 | Weidman et al. | 438/84 |

* cited by examiner

*Primary Examiner* — Walter H Swanson
*Assistant Examiner* — Wilner Jean Baptiste
(74) *Attorney, Agent, or Firm* — Blakely Sokoloff Taylor Zafman LLP

(57) ABSTRACT

A method for fabricating a semiconductor device is described. A substrate is provided having a patterned dielectric layer disposed thereon. A trench is formed in the dielectric layer. The surfaces of the trench are treated with an ammonia-based plasma process. A metal layer is then formed in the trench.

23 Claims, 9 Drawing Sheets

|  | PRESTEP |
|---|---|
| MaxTime | 0 |
| Mode | Time |
| LiftPosAfterRecEnd | Lift |
| Auto Wafer Placement | True |
| Heater Temp | 335.0 degC |
| RFBackToBack | True |
| RFMatchByHead | True |
| HighFreq RF cal table | T1 |
| RFMatchSet1 | M4 |
| RFMatchSet2 | M4 |
| HFRF PwrFaultLmt | 100.0 W |
| HFRF PwrWarnLmt | 50.0 W |
| HFRF PwrDevTimeout | 10.0 s |
| LFRF PwrFaultLmt | 100.0 W |
| LFRF PwrWarnLmt | 50.0 W |
| LFRF Pw DevTimeout | 10.0 s |

400 heater temperature

FIG. 4

| | Stabilization Operation | Ammonia Treatment Operation | | Sample Lift Operation | Pump |
|---|---|---|---|---|---|
| | | C 335 NH3 TREAT | | | |
| Step # | 1 | 2 | | 3 | 4 |
| Name | stab | NH3 trt | | Lift | Pump |
| ChLocation | CHC | CHC | | CHC | CHC |
| Mode | Time | Time | | Time | Time |
| MaxTime | 7 | 30 | | 5 | 5 |
| PressMode | Servo | Servo | | Servo | AbsCrtl |
| Press | 4.2 | 4.2 | | 4.2 | 90 |
| TV position | | | | | |
| PressRampRate | | | | | |
| TVRampRate | | | | | |
| LiftPos | Process | Process | | Process | Lift |
| HtrSpace1 | 0.35 | 0.35 | 0.35 | 1.4 | 1.6 |
| RF1Time | | 30 | 30 | 1.4 | 1.6 |
| HighFreqRF1Pwr | | 375 | 375 | | |
| RFMatchSet1 | M4 | M4 | M4 | M4 | M4 |
| LowFreqRF1Pwr | | | | | |
| RPS | Off | Off | | Off | Off |
| 3MS (sccm) | | | | | |
| NH3 (sccm) | 160 | 160 | ToCh | | PTrF |
| N2 (sccm) | 16000 | 16000 | ToCh | 2000 | PTrF |
| He (sccm) | ToCh | ToCh | | ToCh | |
| O2 (sccm) | ToCh | ToCh | | | |
| CO2 (sccm) | | | | | |

FIG. 5

AMMONIA-BASED PLASMA TREATMENT FOR METAL FILL IN NARROW FEATURES

CROSS REFERENCE TO RELATED APPLICATIONS

This application claims the benefit of U.S. Provisional Application No. 60/984,709, filed Nov. 1, 2007, the entire contents of which are hereby incorporated by reference herein.

BACKGROUND

1) Field

Embodiments of the invention are in the field of semiconductor processing and, in particular, ammonia-based plasma treatments for metal fill in narrow features.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity. Scaling has not been without consequence, however. For example, as the dimensions of the fundamental building blocks of microelectronic circuitry are reduced and as the sheer number of fundamental building blocks fabricated in a given region is increased, the performance requirements of the materials used in these building blocks have become exceedingly demanding. One example is the need to deposit metal films in trenches having high aspect ratios and relatively very small dimensions.

Contacts and vias may be formed by a damascene process. In such a process, a trench is patterned in a dielectric layer and subsequently filled with a metal film. However, as constraints on dimensions increase, problems may arise with conventional filling approaches. For example, FIGS. 1A-1F illustrate cross-sectional views representing operations in a conventional damascene process wherein the dimensions have become too fine for a successful damascene fill.

Referring to FIG. 1A, a patterned dielectric layer 102 is formed above a substrate 100. Patterned dielectric layer 100 has trenches 104 formed therein. A typical patterning scheme used to form patterned dielectric layer 102 may include an etch process (to form trenches 104), an ash process (to oxidize and remove polymers formed during the etch process), and a wet clean process (to remove residues not removed by the ash process). However, residues 106 can be left behind along the surfaces of trench 104, as depicted in FIG. 1A.

Referring to FIG. 1B, a heating process may be carried out in order to remove condensed water (from the wet clean process) or other volatile contaminants. However, certain residues 106, such as polymeric or partially oxidized residues, may not be removed by the heating operation.

Referring to FIG. 1C, a metal barrier layer 108 is deposited over patterned dielectric layer 102 and in trenches 104. However, metal barrier layer 108 may undesirably be deposited over residues 106. Heat treatment of the metal barrier layer 108 is then carried out prior to metal fill of trench 104. Referring to FIG. 1D, this heat treatment may cause residues 106 to volatilize or out-gas (partially volatilize), as depicted by the arrows.

Referring to FIG. 1E, any out-gassing or complete volatilization of residues 106 during the heat treatment of metal barrier layer 108 may cause damage 110 to metal barrier layer 108. Damage 110 may be in the form of non-uniformity of the top surface of metal barrier layer 108 or in the form of craters formed in metal barrier layer 108. Such damage may detrimentally impact a nucleation layer formed on the surface of metal barrier layer 108. Referring to FIG. 1F, a metal layer 112 is deposited above metal barrier layer 108 (or above a nucleation layer which is above barrier layer 108) and in trenches 104. However, voids 114 can be formed within metal layer 112. In particular, trenches 104 may not be completely filled by metal layer 112 as a result of damage 110 in metal barrier layer 108. As the dimensions of trenches 104 are scaled ever-smaller, the relative size of voids 114 in filled trenches 104 becomes more significant and may hinder the performance of contacts or vias formed therefrom.

SUMMARY

Embodiments of the present invention include a method for fabricating a semiconductor device. In one embodiment, the method includes providing a substrate having a patterned dielectric layer disposed thereon. A trench is formed in the dielectric layer. The surfaces of the trench are treated with an ammonia-based plasma process. Subsequently, a metal layer is formed in the trench.

In another embodiment, a method for fabricating a semiconductor device includes providing a substrate having a patterned dielectric layer disposed thereon. A trench is formed in the dielectric layer by performing etch, ash and wet clean processes. The exposed surfaces of the trench are treated with an ammonia-based plasma process. Subsequently, the exposed surfaces of the trench are heated. A metal barrier layer is formed to cover the exposed surfaces of the trench. The metal barrier layer is heated and pre-soaked. A metal layer is then formed in the trench to fill the trench.

BRIEF DESCRIPTION OF THE DRAWINGS

FIG. 4 depicts a chart listing tool preparation conditions in a Centura® platform plasma-enhanced chemical vapor deposition (PE-CVD) chamber for an ammonia-based plasma treatment, in accordance with an embodiment of the present invention.

FIG. 5 depicts a chart listing tool process conditions in a Centura® platform plasma-enhanced chemical vapor deposition (PE-CVD) chamber for an ammonia-based plasma treatment, in accordance with an embodiment of the present invention.

DETAILED DESCRIPTION

An ammonia-based plasma treatment for metal fill in narrow features is described. In the following description, numerous specific details are set forth, such as fabrication process operations and plasma conditions, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Disclosed herein is an ammonia-based plasma treatment for metal fill in narrow features. A substrate may be provided having a patterned dielectric layer disposed thereon. In accordance with an embodiment of the present invention, a trench is formed in the dielectric layer. In one embodiment, the surfaces of the trench are treated with an ammonia-based plasma process. Subsequent to this treatment, a metal layer may be formed in the trench.

The use of an ammonia-based plasma treatment for metal fill in narrow features may enable the complete fill of ever-smaller trench widths by a metal deposition process. For example, a very thin metal barrier layer may be used to form a liner in a trench of a patterned dielectric layer. In accordance with an embodiment of the present invention, residues are removed that would otherwise remain in the trench at the time of deposition of the metal barrier layer, leading to subsequent damage of the metal barrier layer and, consequently, to an incomplete fill of the trench by a fill metal layer. Accordingly, in one embodiment, an ammonia-based plasma treatment is carried out prior to the formation of the metal barrier layer. In a specific embodiment, the ammonia-based plasma treatment removes essentially all residues from the exposed surfaces of trenches formed in a dielectric layer. A metal barrier layer is then formed and maintained substantially damage-free. In one embodiment, a subsequent fill metal deposition process completely fills the trench on the surfaces of the damage-free metal barrier layer.

Figure 1A:
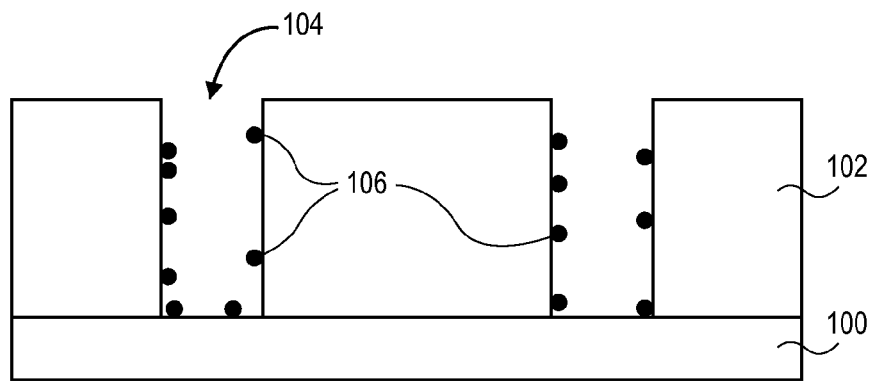
FIG. 1A-1F illustrate cross-sectional views representing operations in a conventional damascene process wherein the dimensions have become too fine for a successful damascene fill.
Figure 1B:
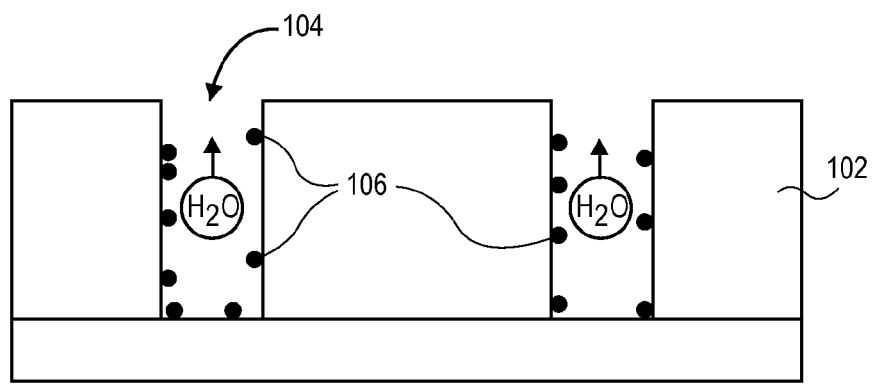
Figure 1C:
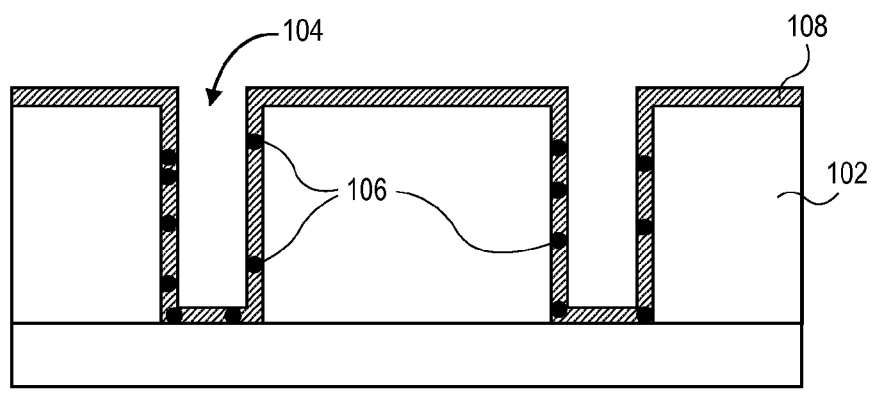
Figure 1D:
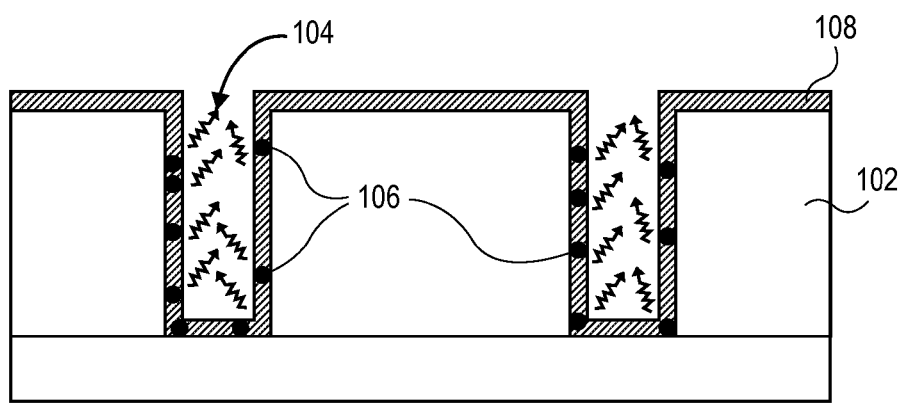
Figure 1E:
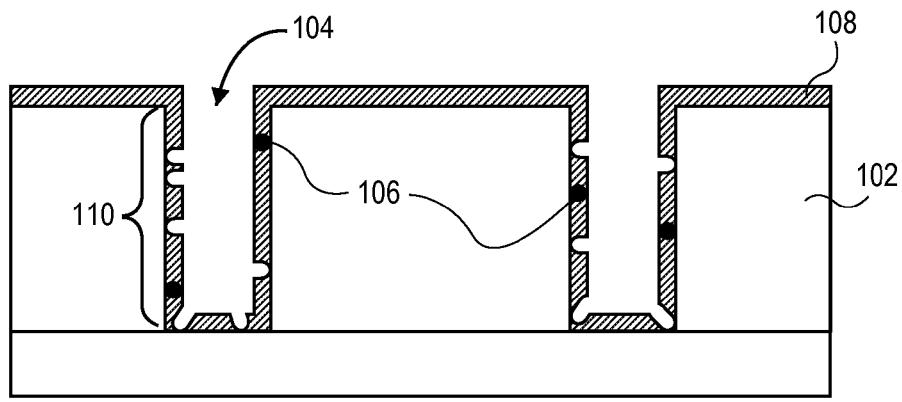
Figure 1F:
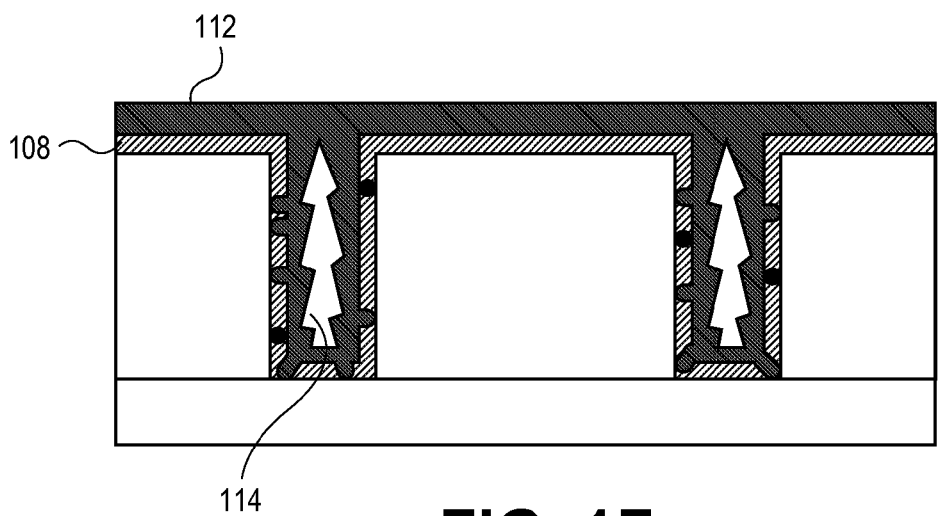
Figure 2:
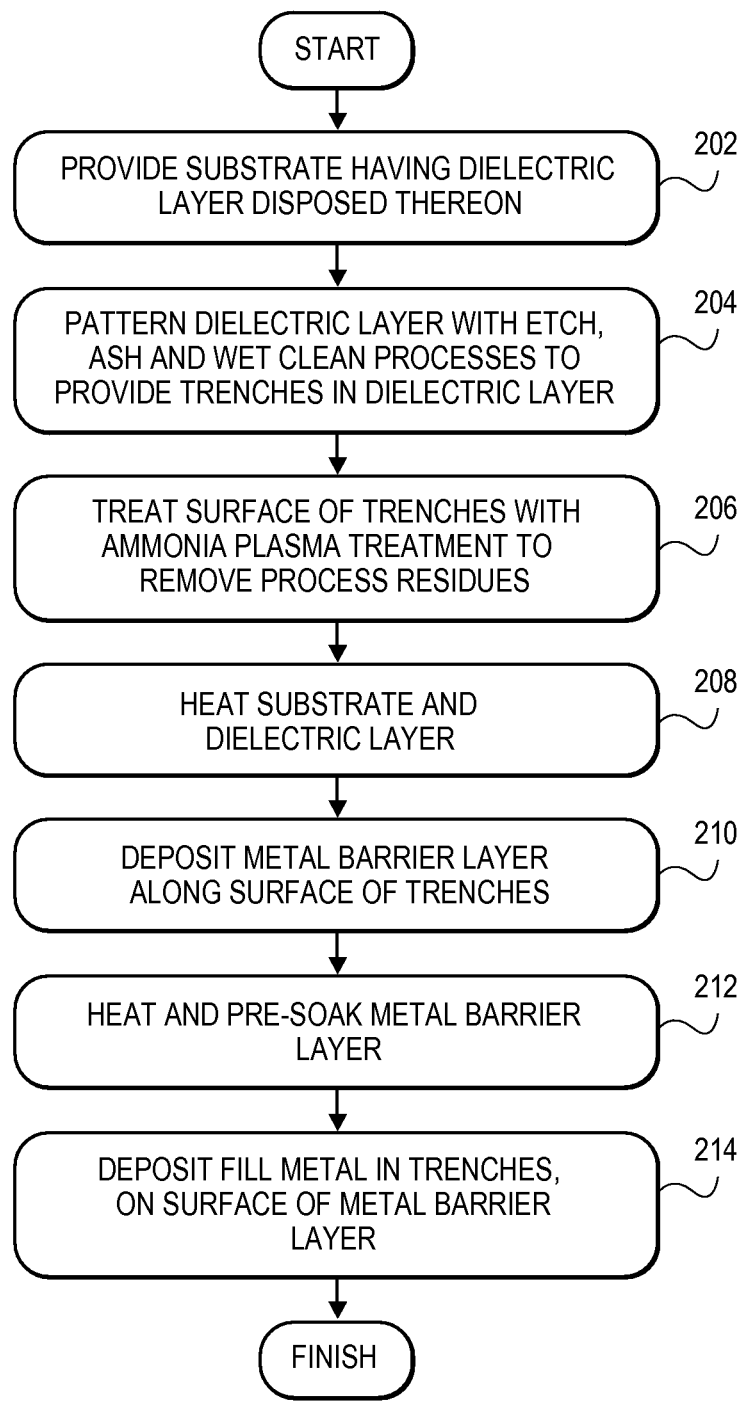
FIG. 2 depicts a flowchart representing a series of operations in a damascene process incorporating an ammonia-based plasma treatment, in accordance with an embodiment of the present invention.

An ammonia-based plasma treatment may be used for metal fill in narrow features. FIG. 2 depicts a Flowchart 200 representing a series of operations in a damascene process incorporating an ammonia-based plasma treatment, in accordance with an embodiment of the present invention. FIGS. 3A-3F illustrate cross-sectional views representing operations in a damascene process incorporating an ammonia-based plasma treatment, in accordance with an embodiment of the present invention.

Figure 3A:
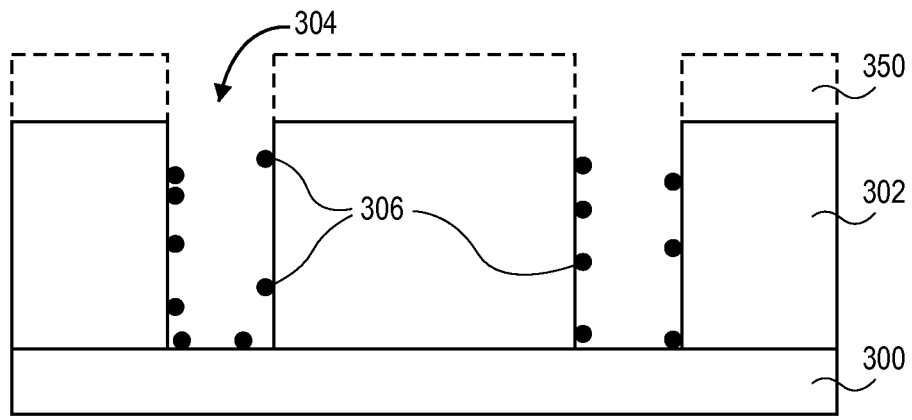
FIGS. 3A-3F illustrate cross-sectional views representing operations in a damascene process incorporating an ammonia-based plasma treatment, in accordance with an embodiment of the present invention.

Referring to operations 202 and 204 of Flowchart 200 and corresponding FIG. 3A, a substrate 300 is provided having a patterned dielectric layer 302 disposed thereon. Trenches 304 are disposed in patterned dielectric layer 302. In accordance with an embodiment of the present invention, trenches 304 are formed in patterned dielectric layer 302 by an etch process. In one embodiment, an ash process followed by a wet clean process is carried out subsequent to the etch process. In a specific embodiment, residues 306 may be formed during any of the etch, ash or wet clean processes and is disposed in trenches 304. The previous existence of a patterning layer 350 is depicted by the dotted lines in FIG. 3A. In one embodiment, patterning layer 350 is composed of a material such as, but not limited to, a photo-resist material, a bottom anti-reflective coating (BARC) material, or an amorphous carbon material such as an Advanced Patterning Film® from Applied Materials™.

Patterned dielectric layer 302 may be composed of a material suitable to isolate conductive features in a semiconductor structure. In accordance with an embodiment of the present invention, patterned dielectric layer 302 is formed from a material having a dielectric constant approximately in the range of 2-4.5. In one embodiment, patterned dielectric layer 302 is formed from a material such as, but not limited to, silicon dioxide, carbon-doped silicon oxide, or a silane-deposited silicon oxide. Trenches 304 in patterned dielectric layer 302 may be formed by any process suitable to create trenches having a desired dimension. In one embodiment, trenches 304 are formed by a plasma etch process. In a specific embodiment, the plasma etch process uses a plasma derived from a gas such as, but not limited to carbon tetrafluoride ($CF_4$), trifluoromethane ($CHF_3$), oxygen ($O_2$), hydrogen bromide (HBr) or chlorine ($Cl_2$).

Residues 306 may be any by-product generated during the formation of trenches 304 in patterned dielectric layer 302. In accordance with an embodiment of the present invention, residues 306 include polymeric residues formed during a plasma etch process used to form trenches 304. For example, in an embodiment, residues 306 may be formed by exposing patterning layer 350 to the plasma etch process. In one embodiment, the plasma etch process uses a plasma derived from a fluorocarbon gas, such as but not limited to, $CF_4$ or $CHF_3$, and residues 306 are composed of a fluorocarbon polymer. An ash process may be carried out subsequent to the plasma etch process used to form trenches 304. In an embodiment, the ash process removes Advanced Patterning Film®, available from Applied Materials™, or any patterning carbon-based film such as a spin-on film or a remaining photo-resist layer. The ash process may aid with the removal of some, but not necessarily all, residues 306 formed during the plasma etch process. For example, in one embodiment, the ash process only partially oxidizes some of the polymer formed during the plasma etch process and residues 306 are composed of a partially oxidized polymer. In another embodiment, some polymers formed during the plasma etch process are impermeable to the ash process and residues 306 are composed of non-oxidized polymer even though an ash process was performed. In a specific embodiment, residues 306 are composed of both non-oxidized polymers and partially oxidized polymers.

The dimensions of trenches 304 may be any dimensions suitable for a conductive contact or via formed in a semiconductor structure. In accordance with an embodiment of the present invention, trenches 304 are high aspect ratio trenches with relatively fine features. For example, in one embodiment, each trench 304 has a depth to width ratio approximately in the range of 6:1 to 10:1. In a specific embodiment, each trench 304 has a depth approximately in the range of 200-300 nanometers and a width approximately in the range of 35-45 nanometers.

Figure 3B:
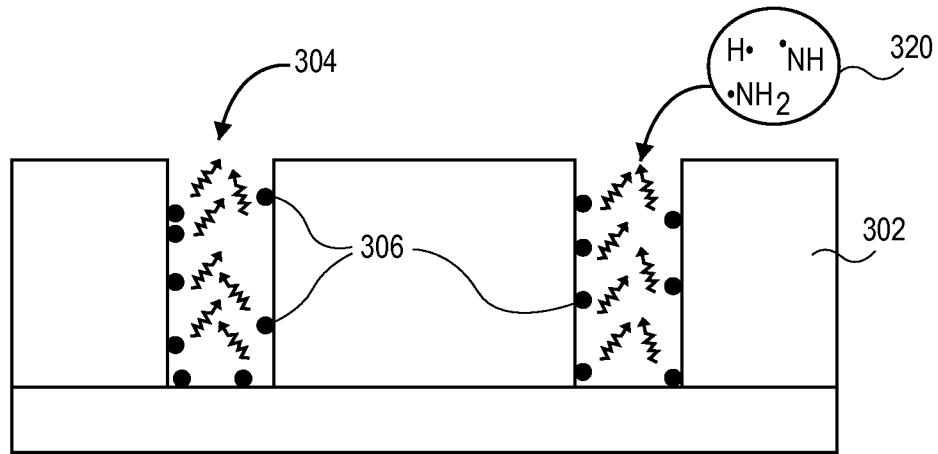

Referring to operation 206 of Flowchart 200 and corresponding FIG. 3B, prior to forming a metal barrier layer, the surfaces of trenches 304 are treated with an ammonia-based plasma 320 to remove residues 306. In one embodiment, the ammonia based plasma 320 is composed of radicals such as, but not limited to, hydrogen (H) radicals, $NH_2$ radicals, and NH di-radicals. These radicals may interact with residues 306 and the surfaces of trenches 304 to remove residues 306 and to form a surface in trenches 304 amenable to deposition of a metal barrier layer. For example, in one embodiment, hydrogen radicals from ammonia-based plasma 320 react with residues 306 to form volatile by-products, as indicated by the squiggly arrows in FIG. 3B. In a specific embodiment, nitrogen-based radicals formed from ammonia-based plasma 320, such as $NH_2$ radicals and NH di-radicals, interact with the surfaces of trenches 304 to generate a nitrogen-based surface termination amenable to the deposition of a metal barrier layer.

Figure 3C:
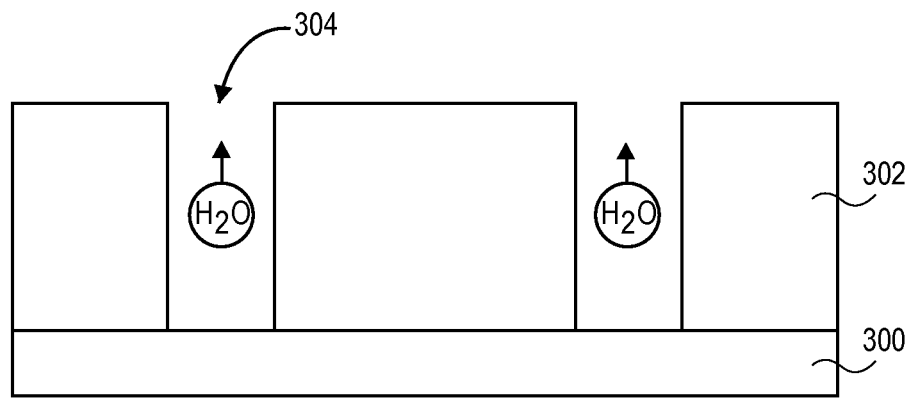

Referring to FIG. 3C, essentially all of residues 306 are removed from trenches 304 by the ammonia-based plasma process of operation 206 to form substantially residue-free trenches 304. Referring to operation 208 of Flowchart 200, substrate 300 and patterned dielectric layer 302 may then be heated to remove moisture or any remaining volatile contaminants from trenches 304. In one embodiment, substrate 300 and patterned dielectric layer 302 are heated to a temperature approximately in the range of 300-350 degrees Celsius to remove moisture or any remaining volatile contaminants from trenches 304.

Figure 3D:
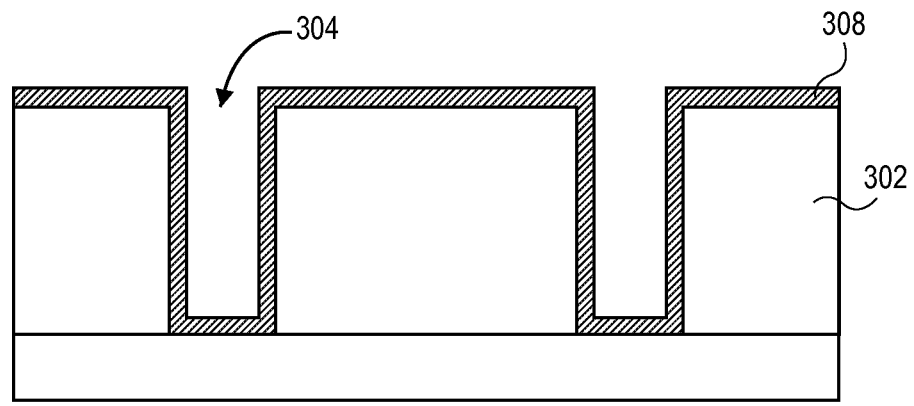

Referring to operation 210 of Flowchart 200 and corresponding FIG. 3D, a metal barrier layer 308 is deposited above patterned dielectric layer 302 and in trenches 304. Metal barrier layer 304 may be composed of any material suitable to aid in the formation of a metal-filled trench in a subsequent deposition process. For example, in accordance with an embodiment of the present invention, metal barrier layer 308 is composed of a material such as, but not limited to, titanium, titanium nitride or tantalum nitride. In one embodiment, metal barrier layer 308 is composed of titanium nitride and is formed by a physical vapor deposition process. Depending upon the thickness of metal barrier layer 308, residues 306 remaining in trenches 304 (as depicted in FIG. 3A) may not significantly impact metal barrier layer 308 and, hence, may not impact a subsequent metal fill process. However, in accordance with an embodiment of the present invention, a very thin metal barrier layer 308 is first formed and does not substantially fill trenches 304. A thin metal barrier layer 308 may be used to limit the resistance provided by such a layer in the formation of a conductive region (e.g., metal barrier layer 308 is usually far less conductive than a fill metal). The thickness of metal barrier layer 308 may be thin enough such that any significant residues 306 remaining in trenches 304 would otherwise adversely impact the integrity of metal barrier layer 308. Thus, in an embodiment, the thickness of metal barrier layer 308 is such that performing an ammonia-based plasma process on dielectric layer 302 is beneficial prior to the deposition of metal barrier layer 308 in order to remove essentially all of residues 306. In one embodiment, metal barrier layer 308 has a thickness of approximately, or less than, 10 nanometers. In a specific embodiment, metal barrier layer 308 has a thickness of approximately, or less than, 5 nanometers.

Referring to operation 212 of Flowchart 200, in accordance with an embodiment of the present invention, metal barrier layer 308 is subjected to heat treatment and a pre-soak process subsequent to its deposition and prior to a fill metal deposition process. In one embodiment, the pre-soak process includes subjecting metal barrier layer 308 to silane or di-borane in order to functionalize the surface of metal barrier layer 308 with dangling bonds.

Figure 3E:
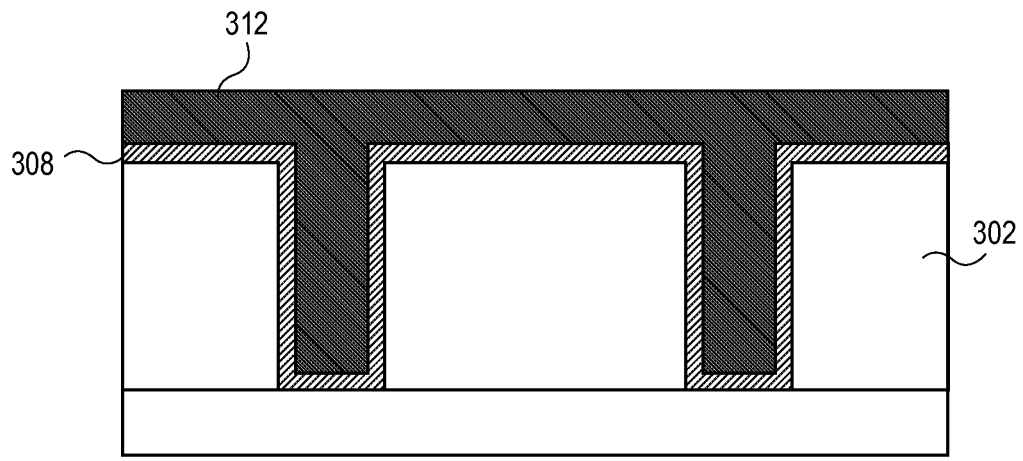

Referring to operation 214 of Flowchart 200 and corresponding FIG. 3E, a metal layer 312 is deposited above metal barrier layer 308 and in trenches 304. In accordance with an embodiment of the present invention, the deposition of metal layer 312 is carried out in two distinct process operations.

First, a nucleation portion is formed. In one embodiment, the nucleation portion is composed of tungsten and is formed by a chemical vapor deposition process using tungsten hexafluoride ($WF_6$) as a precursor deposition gas. Next, the fill metal portion is formed. Metal layer 312 may be composed of any material suitable to fill trenches 304 and to form a bond with metal barrier layer 308. In one embodiment, the fill metal portion of metal layer 312 is composed of tungsten and is deposited by a chemical vapor deposition process. In a specific embodiment, trapped residues 306 (if not otherwise removed with the ammonia-based plasma treatment described above) will out-gas or affect the nucleation rate during the formation of the nucleation portion and cause voids in the fill metal portion. However, as depicted in FIG. 3E, and in accordance with an embodiment of the present invention, the filled trenches 304 are essentially void-free. Thus, in one embodiment, the nucleation portion of metal layer 312 is deposited above an essentially damage-free metal barrier layer 308 (e.g., metal barrier layer 308 is substantially uniform and crater-free) and results in an essentially damage-free nucleation portion. In that embodiment, metal layer 312 fills trenches 304 without the formation of voids.

Figure 3F:
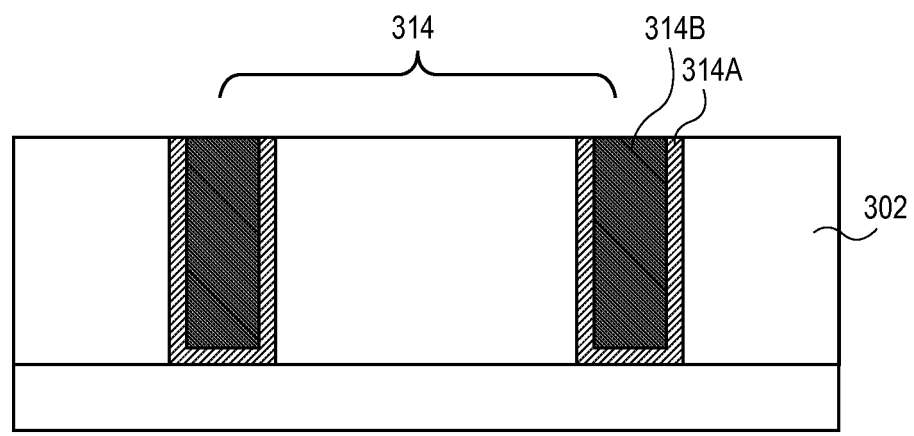

Referring to FIG. 3F, and in accordance with an embodiment of the present invention, the structure described in FIG. 3E is planarized to expose the top surface of patterned dielectric layer 302 and to form isolated conductive features 314 in patterned dielectric layer 302. Conductive features 314 are composed of a liner layer 314A formed from metal barrier layer 308 and a conductive portion 314B formed from metal layer 312. Such features may be used as contacts or vias in the fabrication of an integrated circuit.

An ammonia-based plasma process for removing residues from a trench formed in a dielectric layer may be carried out in any fabrication chamber suitable to generate such a plasma in the presence of a sample. For example, in accordance with an embodiment of the present invention, a chamber in a plasma-enhanced chemical vapor deposition (PE-CVD) process tool is used. In one embodiment, the PE-CVD chamber is, or is configured similar to, a PE-CVD chamber in an Applied Materials™ Centura® platform.

A process chamber may require preparation prior to the introduction of a sample for undergoing an ammonia-based plasma treatment. For example, in one embodiment, the chamber requires pre-heating to a temperature approximately in the range of 300-400 degrees Celsius. FIG. 4 depicts a chart 400 listing tool preparation conditions in a Centura® platform PE-CVD chamber for an ammonia-based plasma treatment, in accordance with a specific embodiment of the present invention. Referring to chart 400 of FIG. 4, in this specific embodiment, a heater temperature (heater temp) in a PE-CVD chamber is set to approximately 335 degrees Celsius prior to the introduction of a sample undergoing an ammonia-based plasma treatment.

Upon introduction of a sample into a PE-CVD chamber, a process recipe for an ammonium-based plasma treatment may include several separate operations. FIG. 5 depicts a chart 500 listing tool process conditions in a Centura® platform PE-CVD chamber for an ammonia-based plasma treatment, in accordance with an embodiment of the present invention. Referring to chart 500, in one embodiment, a process recipe for an ammonium-based plasma treatment includes 1) a stabilization operation (stab) 2) an ammonia treatment operation (NH3 trt) 3) a sample lift operation (lift) and 4) a pump operation (pump).

In one embodiment, following introduction of the sample undergoing an ammonia-based plasma treatment, the stabilization operation includes flowing $N_2$ gas and $NH_3$ gas in an approximate ratio of 100:1 at a pressure approximately in the range of 1-10 Torr for a duration approximately in the range of 5-10 seconds with no plasma power. In a specific embodiment, as shown in chart 500, the stabilization operation includes flowing 160 sccm of $N_2$ gas (N2 (sccm)) and 16000 sccm of $NH_3$ gas (NH3 (sccm)) at a pressure (Press) of approximately 4.2 Torr for a duration (MaxTime) of approximately 7 seconds with plasma power (HighFreqRF1Pwr) in the off state.

In one embodiment, the ammonia treatment operation includes flowing $N_2$ gas and $NH_3$ gas in an approximate ratio of 100:1 at a pressure approximately in the range of 1-10 Torr for a duration approximately in the range of 25-35 seconds with a plasma power approximately in the range of 350-400 Watts. In a specific embodiment, as shown in chart 500, the ammonia treatment operation includes flowing 160 sccm of $N_2$ gas (N2 (sccm)) and 16000 sccm of $NH_3$ gas (NH3 (sccm)) at a pressure (Press) of approximately 4.2 Torr for a duration (MaxTime) of approximately 30 seconds with a plasma power (HighFreqRF1Pwr) of approximately 375 Watts.

In one embodiment, the sample lift operation includes flowing only $N_2$ gas and at a pressure approximately in the range of 1-10 Torr for a duration approximately in the range of 1-10 seconds with no plasma power. In a specific embodiment, as shown in chart 500, the sample lift operation includes flowing 2000 sccm of $N_2$ gas (N2 (sccm)) at a pressure (Press) of approximately 4.2 Torr for a duration (MaxTime) of approximately 5 seconds with plasma power (HighFreqRF1Pwr) in the off state.

In one embodiment, the pump operation includes bringing the chamber to ambient pressure for a duration approximately in the range of 1-10 seconds with no plasma power. In a specific embodiment, as shown in chart 500, the pump operation includes bringing the chamber to ambient pressure for a duration (MaxTime) of approximately 5 seconds with plasma power (HighFreqRF1Pwr) in the off state.

Figure 6:
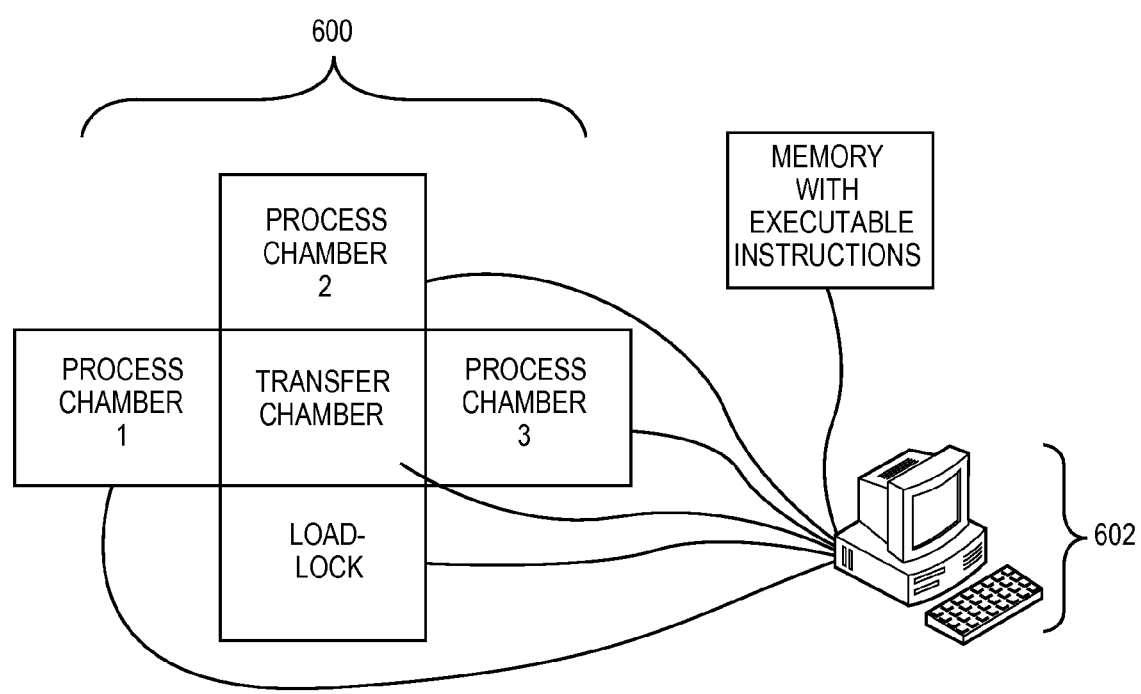
FIG. 6 illustrates a system for carrying out a portion of an integration scheme that utilizes an ammonia-based plasma treatment, in accordance with an embodiment of the present invention.

Several operations of an integration scheme that incorporates an ammonia-based plasma treatment for metal fill in narrow features may be carried out during a single pass in a cluster tool. FIG. 6 illustrates a system for carrying out a portion of an integration scheme that utilizes an ammonia-based plasma treatment, in accordance with an embodiment of the present invention.

Referring to FIG. 6, a cluster tool 600 is coupled with a computing apparatus 602. Cluster tool 600 includes a load-lock through which a sample can be introduced into cluster tool 600. A transfer chamber enables transport of a sample between various process chambers within a single pass (one introduction) of a sample within cluster tool 600. The computing apparatus includes a memory having stored thereon a set of executable instructions for carrying out several operations in an integration scheme that incorporates an ammonia-based plasma treatment. For example, in one embodiment, the set of instructions is executable to first process the sample in process chamber 1, which is a PE-CVD chamber configured to carry out an ammonia-based plasma treatment. In a specific embodiment, the set of instructions is executable to first process the sample in process chamber 1 with 1) a stabilization operation 2) an ammonia treatment operation 3) a sample lift operation and 4) a pump operation. The set of instructions is executable to next process the sample in process chamber 2, which is a physical vapor deposition chamber configured to deposit a metal barrier layer. Finally, the set of instructions is executable to process the sample in process chamber 3, which is a chemical vapor deposition chamber configured to deposit a nucleation layer and/or a metal fill layer.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 7:
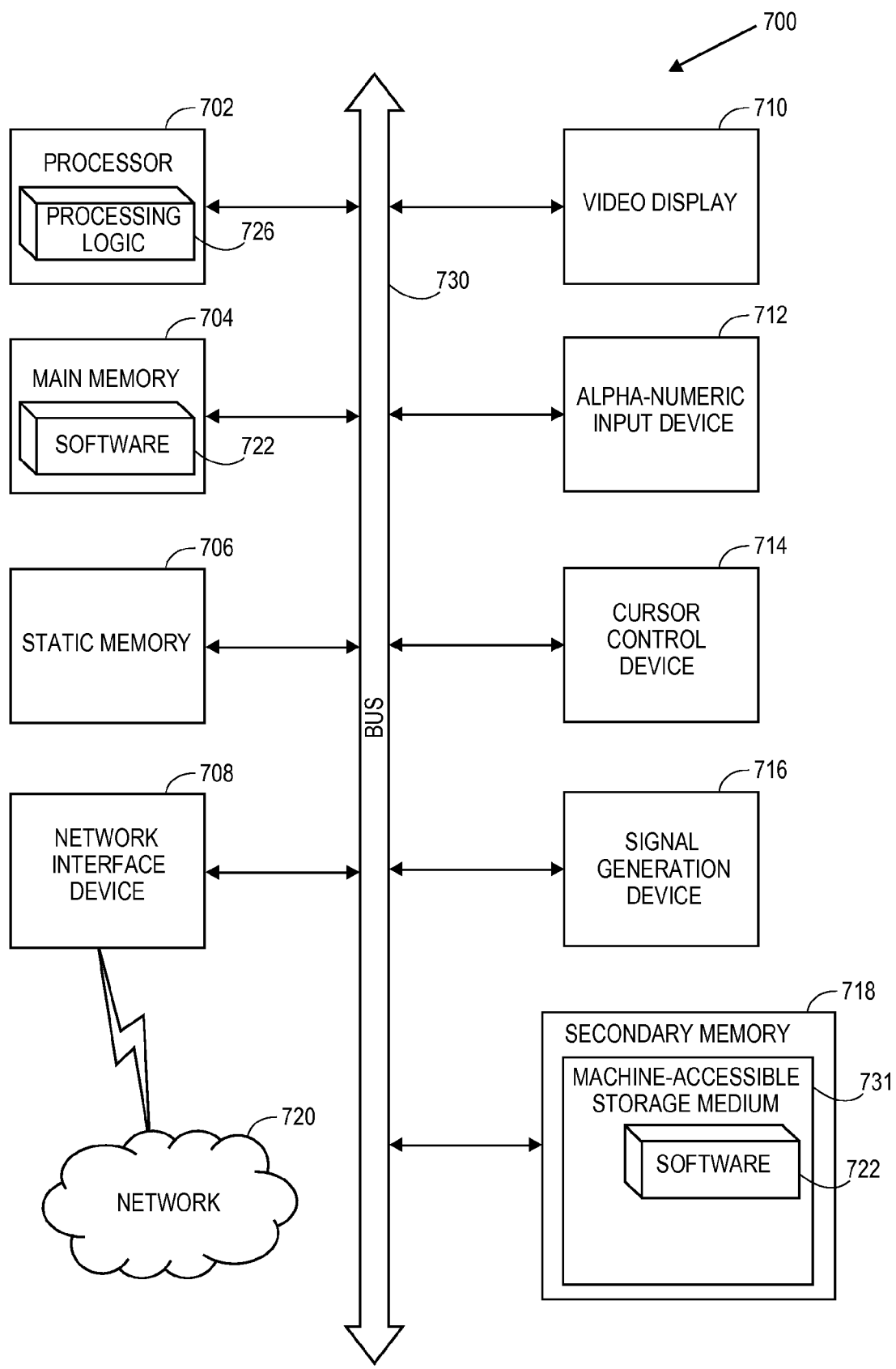
FIG. 7 illustrates a diagrammatic representation of a machine in the exemplary form of a computer system within which a set of instructions, for causing the machine to per-

FIG. 7 illustrates a diagrammatic representation of a machine in the exemplary form of a computer system 700 within which a set of instructions, for causing the machine to perform any one or more of the methodologies discussed herein, may be executed, in accordance with an embodiment of the present invention. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, an ammonia-based plasma treatment for metal fill in narrow features has been disclosed. In accordance with an embodiment of the present invention, a substrate is provided having a patterned dielectric layer disposed thereon. A trench is formed in the dielectric layer. The surfaces of the trench are treated with an ammonia-based plasma process. Subsequent to this treatment, a metal layer is formed in the trench.

What is claimed is:

1. A method for fabricating a semiconductor device, comprising:
   providing a substrate having a patterned dielectric layer disposed thereon;
   forming a dielectric trench in said dielectric layer;
   treating surfaces of said dielectric trench with an ammonia-based plasma process to remove a set of residues from the surfaces of said dielectric trench, said ammonia-based plasma process comprising using a plasma including H radicals, $NH_2$ radicals and NH di-radicals, wherein the H radicals of the plasma react with at least a portion of the set of residues to form volatile by-products; and, subsequently,
   forming a metal layer in said dielectric trench.

2. The method of claim 1, wherein the $NH_2$ radicals and NH di-radicals of the plasma interact with the surfaces of said dielectric trench to generate a nitrogen-based surface termination on the surfaces of said dielectric trench.

3. The method of claim 1, wherein the set of residues comprises a by-product generated during the forming of said dielectric trench in said dielectric layer.

4. The method of claim 1, wherein the set of residues comprises polymeric residues.

5. The method of claim 1, wherein the set of residues comprises fluorocarbon polymer residues.

6. The method of claim 1, wherein the set of residues comprises partially oxidized polymer residues.

7. The method of claim 6, wherein the set of residues further comprises non-oxidized polymer residues.

8. The method of claim 1, wherein the forming of said metal layer in said dielectric trench comprises forming said metal layer in contact with said dielectric trench and to a thickness of, or less than, 10 nanometers.

9. A method for fabricating a semiconductor device, comprising:
   providing a substrate having a patterned dielectric layer disposed thereon;
   forming a dielectric trench, by performing etch, ash and wet clean processes, in said dielectric layer;
   treating exposed surfaces of said dielectric trench with an ammonia-based plasma process to remove a set of residues from the exposed surfaces of said dielectric trench, said ammonia-based plasma process comprising using a plasma including H radicals, $NH_2$ radicals and NH di-radicals wherein the H radicals of the plasma react with at least a portion of the set of residues to form volatile by-products; and, subsequently,
   heating the exposed surfaces of said dielectric trench; and, subsequently,
   forming a metal barrier layer to cover the exposed surfaces of said dielectric trench and to partially fill said dielectric trench;
   heating and pre-soaking said metal barrier layer; and
   forming a metal layer to further fill said dielectric trench.

10. The method of claim 9, wherein the $NH_2$ radicals and NH di-radicals of the plasma interact with the exposed surfaces of said dielectric trench to generate a nitrogen-based surface termination on the exposed surfaces of said dielectric trench.

11. The method of claim 9, wherein the set of residues comprises a by-product generated during the forming of said dielectric trench in said dielectric layer.

12. The method of claim 9, wherein the set of residues comprises polymeric residues.

13. The method of claim 9, wherein the set of residues comprises fluorocarbon polymer residues.

14. The method of claim 9, wherein the set of residues comprises partially oxidized polymer residues.

15. The method of claim 14, wherein the set of residues further comprises non-oxidized polymer residues.

16. The method of claim 9, wherein the forming of said metal barrier layer to cover the exposed surfaces of said dielectric trench comprises forming said metal barrier layer in contact with said dielectric trench and to a thickness of, or less than, 10 nanometers.

17. A method for fabricating a semiconductor device, comprising:
   providing a substrate having a patterned dielectric layer disposed thereon;
   forming a dielectric trench, by performing etch, ash and wet clean processes, in said dielectric layer;
   treating exposed surfaces of said dielectric trench with an ammonia-based plasma process to remove a set of residues from the exposed surfaces of said dielectric trench; and, subsequently,
   heating the exposed surfaces of said dielectric trench; and, subsequently,
   forming a metal barrier layer to cover the exposed surfaces of said dielectric trench and to partially fill said dielectric trench;
   heating and pre-soaking said metal barrier layer; and
   forming a metal layer to further fill said dielectric trench.

18. The method of claim 17, wherein the set of residues comprises a by-product generated during the forming of said dielectric trench in said dielectric layer.

19. The method of claim 17, wherein the set of residues comprises polymeric residues.

20. The method of claim 17, wherein the set of residues comprises fluorocarbon polymer residues.

21. The method of claim 17, wherein the set of residues comprises partially oxidized polymer residues.

22. The method of claim 17, wherein the set of residues further comprises non-oxidized polymer residues.

23. The method of claim 17, wherein the forming of said metal barrier layer to cover the exposed surfaces of said dielectric trench comprises forming said metal barrier layer in contact with said dielectric trench and to a thickness of, or less than, 10 nanometers.

* * * * *